United States Patent [19]
Moravec et al.

[11] Patent Number: 5,596,260
[45] Date of Patent: Jan. 21, 1997

[54] APPARATUS AND METHOD FOR DETERMINING A CHARGE OF A BATTERY

[75] Inventors: Hans P. Moravec, Pittsburgh, Pa.; James R. Beninghaus, Cupertino, Calif.; Michael K. Blackwell; Kevin J. Dowling, both of Pittsburgh, Pa.; J. Rhoads Hollowell, II, Sunnyvale, Calif.

[73] Assignee: Apple Computer, Inc., Cupertino, Calif.

[21] Appl. No.: 242,541

[22] Filed: May 13, 1994

[51] Int. Cl.$^6$ ............................................. H01M 10/48
[52] U.S. Cl. ............................. 320/30; 320/30; 320/39; 320/48; 324/426
[58] Field of Search .................... 320/5, 12, 13, 320/30, 31, 35, 39, 48; 324/426, 431, 433; 340/635, 636; 429/61, 90

[56] References Cited

U.S. PATENT DOCUMENTS

| | | | |
|---|---|---|---|
| 4,338,664 | 7/1982 | Mayer | 324/351 X |
| 4,520,353 | 5/1985 | McAuliffe | 340/636 |
| 4,558,281 | 12/1985 | Codd et al. | 320/48 X |
| 4,868,412 | 9/1989 | Owens | 320/40 X |
| 5,489,836 | 2/1996 | Yuen | 320/32 |
| 5,517,277 | 5/1996 | Goto et al. | 320/48 X |

FOREIGN PATENT DOCUMENTS

| | | |
|---|---|---|
| 0496537 | 1/1992 | European Pat. Off. . |
| 056624 | 3/1993 | European Pat. Off. . |
| 3624781 | 2/1987 | Germany . |

*Primary Examiner*—Edward H. Tso
*Attorney, Agent, or Firm*—Blakely, Sokoloff, Taylor & Zafman

[57] ABSTRACT

In an electronic device powered by a battery, a method of determining a charge of the battery. Initially, a discharge curve specifying the battery's voltage as a function of time is determined. This discharge curve is calibrated according to actual measurements. Next, a battery state model is established. The battery state model is comprised of a number of discrete charge states. The probability of the actual battery's charge for a particular charge state is specified by the battery state model for each of the charge states. The battery's voltage is periodically measured. Based on the measured voltage and the discharge curve, a voltage probability distribution is computed. The battery discharge model is updated by applying Bayes theorem to the old discharge model and the voltage probability distribution. The charge of the battery based on a mean value of the battery discharge model is then displayed.

14 Claims, 9 Drawing Sheets

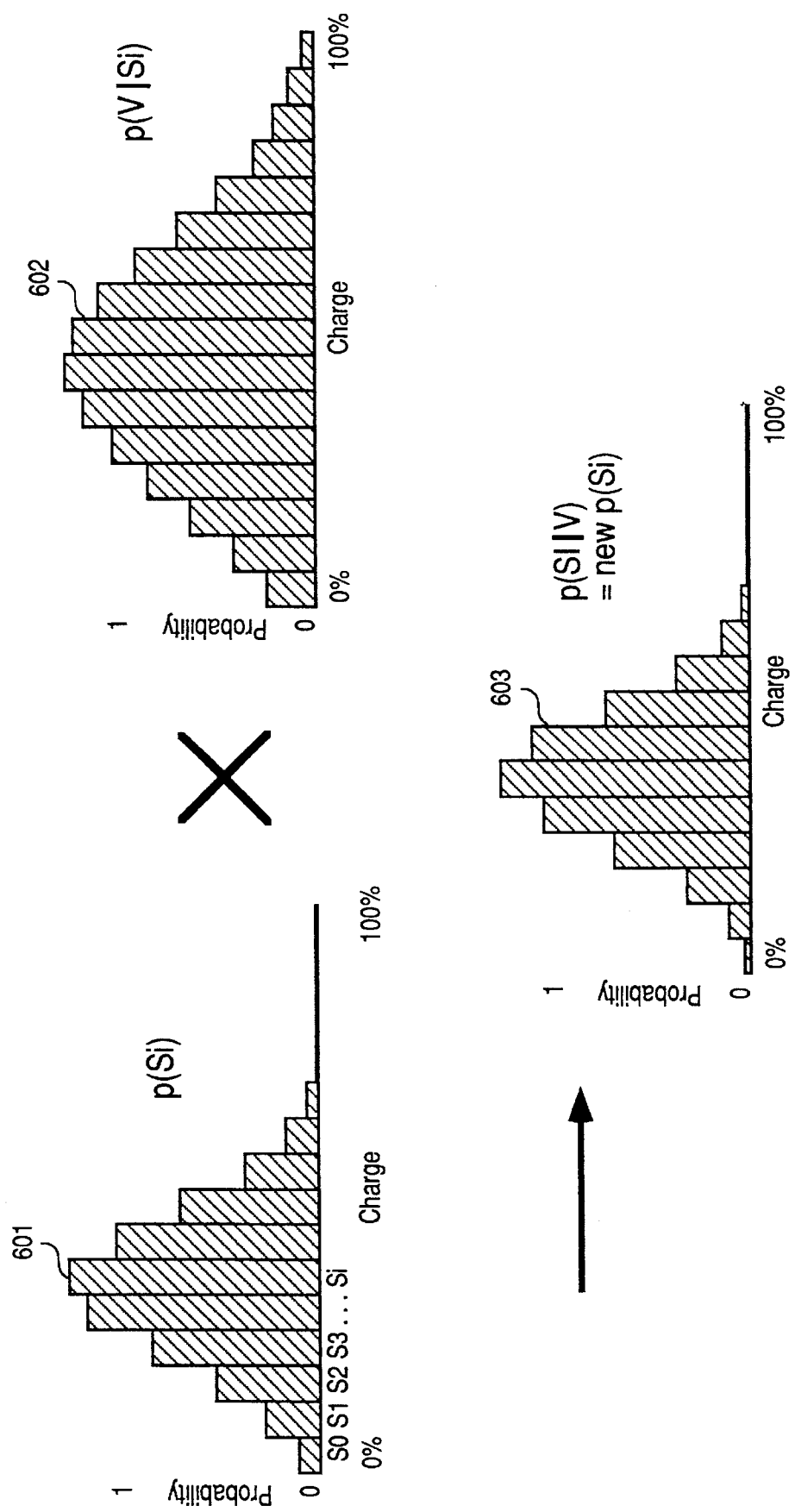

APPARATUS AND METHOD FOR DETERMINING A CHARGE OF A BATTERY

FIELD OF THE INVENTION

The present invention relates to the field of charge storage devices. More particularly, the present invention relates to an apparatus and method of determining the charge of a battery.

BACKGROUND OF THE INVENTION

In the past, computer systems tended to be huge, expensive, highly centralized mainframes. However, advances in the semiconductor and electronic arts led to smaller, more versatile minicomputers, workstations, and personal desktop computers. Today, mobile laptop, notebook, pen-based, and personal digital assistant computer systems are gaining widespread popularity.

These portable computer systems and other electronic devices are often powered by charge storage devices, such as batteries. Users of these devices need to know the present state of charge of the battery. Without such information, it is difficult for the user to guess at the remaining operating time before the battery becomes depleted. A user might experience an inconvenient interruption or worse, lose valuable data due to a power outage. Moreover, knowing the present charge left in the battery is advantageous because when the computer system determines that the battery is in imminent danger of becoming depleted, it may initiate a power conservation feature or automatically shutdown.

In addition, it would be helpful if the user were to be informed of the overall battery condition. In other words, the energy storing capacity of the battery should be indicated to the user. Based on this information, the user knows when the battery needs to be reconditioned or disposed of and replaced.

In spite of these needs, portable electronic devices often lack the capability to monitor the charge consumption and/or the overall condition of the battery. One reason is due to the fact that implementing such a monitoring circuit is complex and costly. In addition, prior art battery monitoring mechanisms typically utilized timers and oscillators. Operation of these timers and oscillators contributed to hasten the depletion of the battery's stored charge.

Besides which, battery monitoring mechanisms tended to be highly inaccurate and unreliable. The most common battery technology, lead-acid, offers predictable linear voltage discharge curves. Unfortunately, lead-acid batteries have approximately half the power density of alternative battery technologies. Hence, lead-acid batteries are not attractive for use in portable applications. Newer technologies such as Nickel-Metal-Hydride (NiMH) and Nickel-Cadmium (NiCd) batteries offer substantially greater power density and charge capacity. However, NiMH and NiCd batteries exhibit complex, often unpredictable discharge characteristics. Consequently, voltage monitoring is an inaccurate and unreliable guide to the charged state of these batteries.

One prior art mechanism for reporting battery energy involves using a fixed maximum energy value and a runtime counter of the energy consumed by the system. The difference between these two values divided by the maximum results in a percentage of charge calculation based on energy units. This calculation is fairly accurate when the energy consumption count is valid. However, there are frequent situations when that count value is invalid or otherwise inaccurate. For example, there might be cumulative errors in runtime readings, battery condition, variance of actual maximums, partial charges, and/or batteries charged externally. Another prior art mechanism involved applying a fixed maximum voltage level to runtime voltage readings. Once again, after normalization, the difference between these two values divided by the maximum results in a percentage of charge calculation based on voltage. However, this voltage based form of energy reporting is one of the least accurate methods. Yet, it is one of the most widely used energy reporting mechanisms because of the limited situations whereby the energy count is valid in the system.

Further complicating matters is the fact that effective battery capacity is dependent on the temperature of the battery under consideration. Changes in temperature over the normal operating range for portable computing (e.g., 20° C.–40° C.) can have a significant impact in the usable energy supplied by a battery. Furthermore, the loading on the battery is highly variable. Sometimes, the battery is heavily loaded, whereas on other occasions, it is lightly loaded.

Thus, there is a need in the prior art for an apparatus and method of determining a charge of a battery. It would be preferable if such an apparatus and method could be implemented with hardware already existing in the portable device.

SUMMARY OF THE INVENTION

The present invention pertains to a method of determining a charge of the battery of a battery operated electronic device. Initially, a battery state model is established. The battery state model is comprised of a number of discrete charge states. These charge states range from full charge (100%) to no charge (0%). The probability of the actual battery's charge for a particular charge state is specified by the battery state model for each of the charge states.

Next, a discharge curve specifying the battery's voltage as a function of time is determined. This discharge curve is calibrated according to actual measurements. For example, the battery can be discharged at different rates under different temperature environments. Once the discharge curve is known, the battery's voltage is periodically measured. Based on the measured voltage and the discharge curve, a voltage probability distribution over the range of battery states can be computed. The battery discharge model is updated by applying Bayes theorem to the old discharge model and the voltage probability distribution. This results in an updated battery discharge model having a smaller variance. The charge of the battery corresponding to the mean value of the battery discharge model is then displayed to the user.

BRIEF DESCRIPTION OF THE DRAWINGS

The present invention is illustrated by way of example, and not by way of limitation, in the figures of the accompanying drawings and in which like reference numerals refer to similar elements and in which:

FIG. 6 shows that the updates for voltage will generally tighten the battery-state distribution, and decrease the charge state uncertainty.

DETAILED DESCRIPTION

An apparatus and method for determining the charge on a battery is described. In the following description, for purposes of explanation, numerous specific details are set forth, such as estimation techniques, current models, temperature models, etc., in order to provide a thorough understanding of the present invention. It will be obvious, however, to one skilled in the art that the present invention may be practiced without these specific details. In other instances, well-known structures and devices are shown in block diagram form in order to avoid unnecessarily obscuring the present invention.

Figure 1:
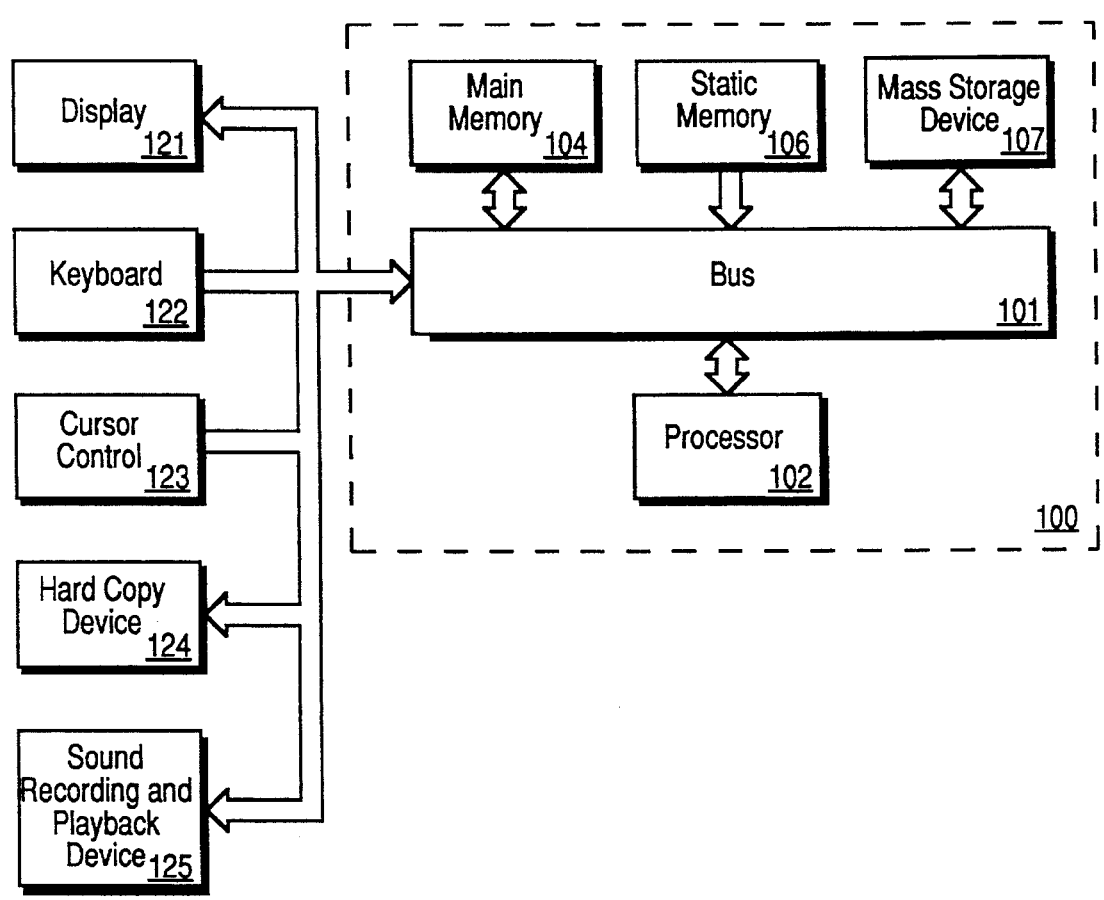
FIG. 1 shows the computer system upon which a preferred embodiment of the present invention is implemented.

Referring to FIG. 1, the computer system upon which a preferred embodiment of the present invention is implemented is shown as 100. Computer system 100 is comprised of a bus or other communication means 101 for communicating information. A microprocessor 102 is coupled with bus 101 for processing digital data. Computer system 100 is further comprised of a random access memory (RAM) or some other dynamic storage device 104 (referred to as main memory), which is also coupled to bus 101. Main memory 104 is used to store digital data and program instructions to be executed by processor 102. Main memory 104 also may be used for storing temporary variables or other intermediate information during execution by processor 102. Computer system 100 also includes a read only memory (ROM) and/or other static storage device 106 coupled to bus 101 for storing static information and instructions for processor 102. In addition, a data storage device 107 such as a magnetic disk or optical disk and its corresponding disk drive may also be included.

Computer system 100 may further include a display device 121, such as a cathode ray tube (CRT) or liquid crystal display (LCD) coupled to bus 101 for displaying information to a computer user. An alphanumeric input device 122 (e.g., a keyboard) may also be coupled to bus 101 for communicating information and command selections to processor 102. An additional user input device which may be coupled to bus 101 is cursor control 123. Input device 123 may take many different forms, such as a mouse, a trackball, stylus, touchpad, etc. Another device which may be coupled to bus 101 is hard copy device 124 which may be used for printing a hard copy on paper. Another device which may be coupled to bus 101 is sound recording and playback device 125 which may be used for recording and playing back sound. It should be noted that any or all of the components of computer system 100 and associated hardware may be used in conjunction with the present invention. However, it is appreciated that any type of configuration of the system may be used for various purposes as the user requires.

In the currently preferred embodiment, computer system 100 is one of the Macintosh® family of laptop computers such as the Macintosh® Powerbook® brand personal computers manufactured by Apple® Computer, Inc. of Cupertino, Calif. (Apple and Powerbook are registered trademarks of Apple Computer, Inc.). Processor 102 is one of the 68000 families of microprocessors, such as the 68030 or 68040 manufactured by Motorola, Inc. of Schaumburg, Ill.

Users will be most interested in two battery parameters: present state of charge, and overall energy-storing capacity. The first is used to determine operating time remaining, while the second is used to determine whether the battery should be reconditioned or disposed. The present invention pertains to a combined model that estimates both of these parameters. However, for the sake of clarity, the state of charge alone is first described below.

Figure 2:
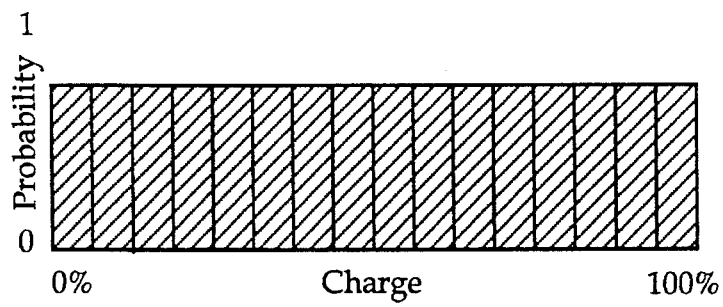
FIG. 2 shows a histogram which might be perfectly flat when nothing at all is known.

The instantaneous direct measurements available—voltage, current, temperatures and time—do not allow an unambiguous determination of charge states. Unmeasured factors such as charge/discharge history and internal battery chemistry affect the relationship. Sometimes, as when a battery is newly installed, the ignorance of its state will be almost total. Only an extended observation of its discharge can gradually provide clarifying information. To model such varying states of partial knowledge, the possible conditions of a battery are divided into discrete intervals. In the currently preferred embodiment, 32 discrete intervals are used to represent empty to full charge states. Bayesian estimation techniques are used to determine the probability of what the actual charge state of the battery is in each of these intervals. The array can be thought of as a histogram of the likelihood that the battery is in various states. When nothing at all is known, the histogram might be perfectly flat as shown in FIG. 2. Only sixteen discrete intervals are shown in FIG. 2. Interval 201 represents 0% charge, whereas interval 202 represents 100% charge. For each of the intervals, there is an associated probability. This probability indicates the likelihood that the battery has that particular % of charge remaining. The probabilities range from 0 (least probable) to 1 (most probable).

Figure 3:
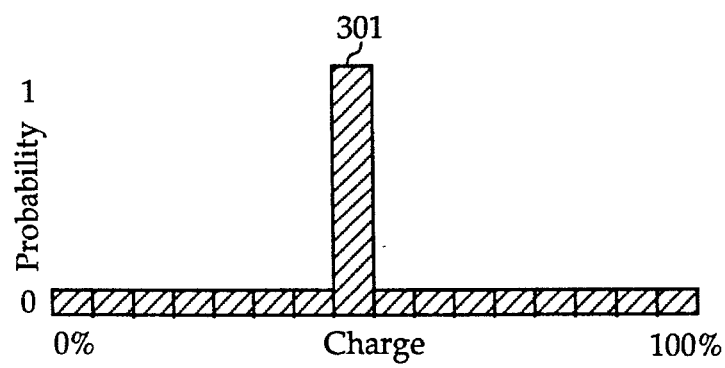
FIG. 3 shows a situation where if the charge state were known perfectly, all the intervals but one might have zero probability.

If the charge state were known perfectly, all the intervals but one might have zero probability. This situation is shown in FIG. 3. The interval 301 has a probability of 1, whereas the other intervals have 0 probability. Based on this information, it is known that the battery has 50% charge (e.g., the charge corresponding to interval 301).

Figure 4:
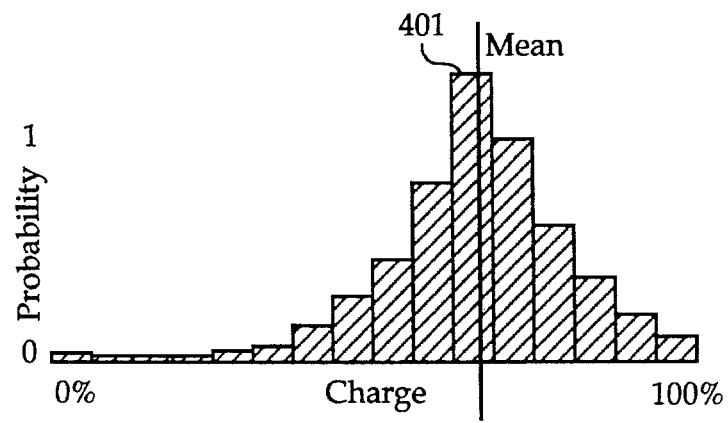
FIG. 4 shows a fully informed model which is represented by an approximation to a narrow normal curve.

The previous case does not allow for resolving the charge more finely than the width of one of the charge intervals. A bit of noise helps alleviate this condition and in practice, a fully informed model is represented by an approximation to a narrow normal curve, as shown in FIG. 4. The mean of the curve is shown as residing in interval 401. The mean represents the actual charge state. The mean value moves a fraction of an interval simply by slightly raising the values upstream of the mean, and lowering the downstream values. The variance of the distribution can be calculated to give an estimate of the model's uncertainty. For some applications, such as a gas-meter display, the probability values of the entire distribution might be displayed as gray levels. This allows the user to visually find the mean, estimate the spread, and perhaps deduce more subtle properties.

The following description describes how measurements are incorporated into the battery state model. To model the flow of current out of the battery (e.g., as indicated by a coulomb meter), the probability distribution is shifted in the direction of reduced charge. An example of this is shown in FIG. 4. Regardless of what the initial battery state was before a charge increment was withdrawn, it will be a certain amount lower afterwards. Since the precise relationship of external current to charge state is uncertain, this operation also introduces a spreading of the distribution. Thus, coulomb-meter measurements tend to flatten the battery state distribution (i.e., increase its uncertainty).

On the other hand, voltage measurements sharpen the battery-state distribution. In one embodiment, Bayes' theorem from probability theory is applied. Bayes' theorem states that:

$$p(Si \mid V) = p(V \mid Si) \times p(Si) / \Sigma_j p(V \mid Sj) \times p(Sj) = p(V \mid Si) \times p(Si) / p(V).$$

Figure 5:
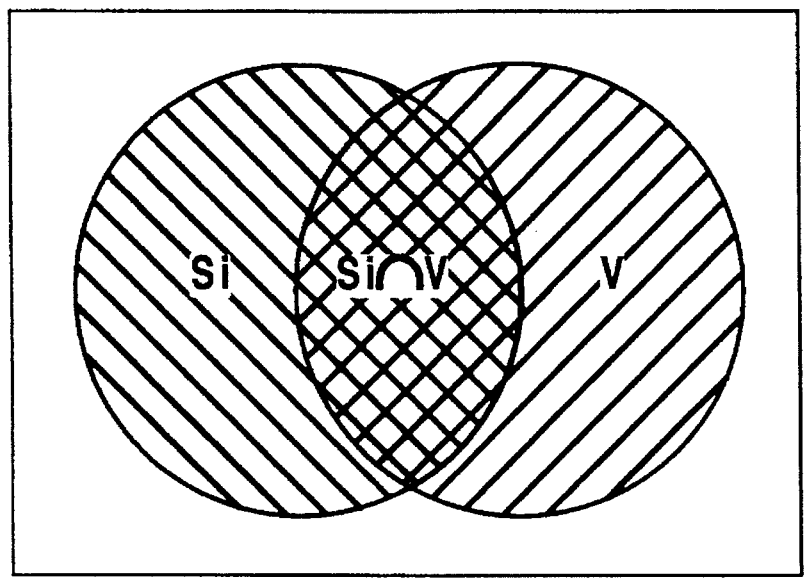
FIG. 5 shows a Venn diagram of Si and V.

In order to update the probability of each charge state Si, given a measured terminal voltage V, the old probability of Si is multiplied by the probability of finding voltage V if the charge state was Si (a quantity that will be extracted from an empirical battery model, which is discussed below). The result is then divided by a normalizing factor to ensure that the sum of all the updated probabilities remains unity. This relationship is a simple identity, as can be seen by examining a Venn diagram of Si and V, as shown in FIG. 5. It is given that for any A and B, $p(A \mid B)$, the probability of condition A, assuming that condition B holds, is equal to $p(A \cap B)/p(B)$, that is the area of the intersection of A and B, divided by the area of B.

Referring to FIG. 5, it can be seen that $p(Si \mid V) = p(V \mid Si) \times p(Si)/p(V)$ and $p(Si \cap V)/p(V) = p(Si \cap V)/p(Si) \times p(Si)/p(V)$. In general, p(V,Si) over the range of battery states Si resembles a normal curve with a different mean for each possible voltage V. In addition, p(V,Si) has a spread related to the flatness of the battery discharge curve in the vicinity of that voltage. In other words, in flat regions the spread is large, since the uncertainty of charge state is large; while in steep regions, the spread is narrow.

Each time a voltage reading is taken, the battery state curve will be multiplied (not convolved) by one of these p(V,Si) curves. Repeated multiplications by a normal curve with a particular spread results in a curve with a smaller spread. Thus, updates for voltage will generally tighten the battery-state distribution, and decrease the charge state uncertainty. This phenomenon is shown in FIG. 6. It can be seen that as the p(Si) distribution 601 is multiplied by the p(V | Si) distribution 602, the resulting $p(Si \mid V) = P_{new}(Si)$ distribution 603 has a narrower variance (i.e., more accurate).

In one embodiment, the battery condition is estimated. The battery charge model described above can be expanded to represent total battery charge capacity as well as charge state. This is accomplished in one embodiment by expanding the hypothesis space Si to include all possible combinations of charge state and capacity (Si,Ci). In this embodiment, Si is quantized into thirty-two steps representing 0% to 100% discharge, and Ci is quantized into sixteen intervals representing 75% to 125% of nominal capacity. Next, updating steps are performed at 30 second intervals. In the updating steps, each of the 512 (32×16) values are modified by a calculation that refers to the coulomb counter, voltage, and temperature measurements. In addition, a table containing a battery model specific for the type of battery powering the computers is also consulted.

Battery condition and charge state information are then extracted from the p(Si,Ci) array by computing a probability-weighted mean across the rows and columns of the whole array. In addition, the program computes a remaining mean energy. In one embodiment, this is accomplished by performing a weighted sum over the whole array multiplied by the average voltage for the remaining part of the discharge at each point, obtained from a nominal calibration curve.

In another embodiment, the battery models are empirically derived. The process of deriving the p(Si | V) functions modeling the battery charge state/voltage relationship begins with a data-collection phase. The computer system containing the battery is placed in, and interfaced to, a temperature-controlled chamber. It is programmed to repeatedly bring its battery to full charge (e.g., via a serial-port controlled external relay connecting it to a charger), and then it is fully discharged. The discharge is performed under a systematic schedule of temperatures and power loads. Time, temperature, terminal voltage and amperage are logged approximately once per minute during each discharge. Percentage charge cannot be determined directly during a discharge. Instead, it is deduced retroactively from a record of incremental current flow over a complete discharge cycle.

Figure 7:
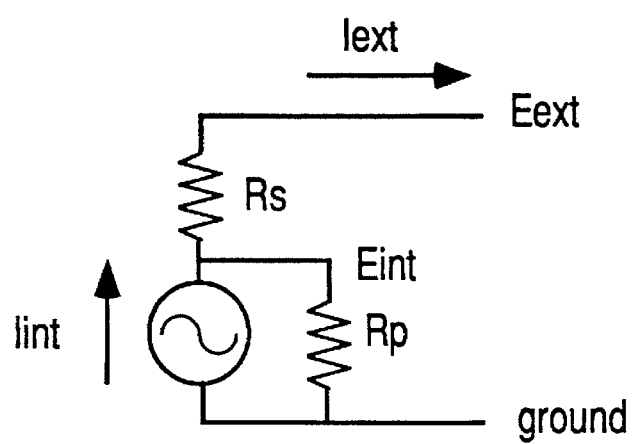
FIG. 7 shows an internal model of the battery.

Based on these discharge curves, battery parameters can be determined. The discharge curves, giving current and voltage external to the battery at particular times, do not directly reveal the internal charge state of the battery. In order to calculate an approximation of the actual state, data is collected at fixed temperatures. Furthermore, an internal model of the battery shown in FIG. 7 is assumed. Referring to FIG. 7, the following terms are defined:

| | |
|---|---|
| Eext | External Voltage |
| Iext | External Current |
| Eint | Internal Voltage |
| Iint | Internal Current |
| Rs | Series Resistance |
| Rp | Parallel Resistance. |

Instantaneously, the values in the battery model are related by:

$$Iext = Iint - Eint/Rp$$

$$Eext = Eint - Iext*Rs.$$

Pairs of discharge curves are processed from the same battery, with very different loadings. For example, in the "fast" curve 801, the computer system was run at 33 MHz with full backlight and disk powered except for brief pauses, for an average power about 6 watts. The "slow" curve 802 was obtained with backlight and disk mostly off, at 16 MHz, using about 1.5 watts. In both cases, temperatures, voltage, power and coulomb count were sampled every thirty seconds. It should be noted that the numerical values given throughout this description are offered as examples. Other values may also be used.

Figure 8:
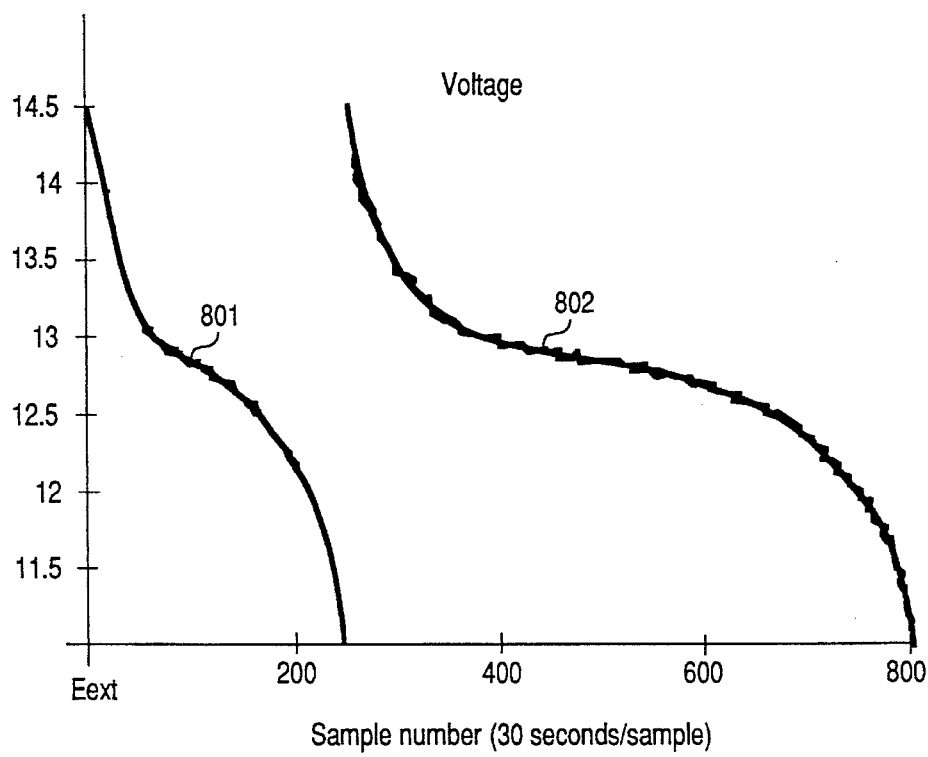
FIG. 8 shows an example of the pair of external voltage profiles.

An example is now offered with respect to the pair of external voltage profiles shown in FIG. 8. The external voltage Eext and external current Iext can be directly measured. Internal voltage Eint is assumed to vary in relation to the discharge state. Internal series resistance Rs and internal parallel resistance Rp are assumed to be constant for a first approximation. Internal current Iint represents the actual discharge rate of the battery. Its integral over a full discharge is defined to be a constant, Qtot, which represents the internal charge capacity of the battery. It is also assumed that the integral voltage Eint at the start of each discharge of the battery is a constant (e.g., the battery's maximum terminal voltage).

At the beginning of each discharge, the second equation above becomes:

$$Eext = Einit - Iext * Rs$$

By substituting measured values of Eext and Iext from the start of the two discharges, this becomes two equations in two unknowns, Einit and Rs. Solving them produces two parameters of the battery model:

$$Einit = 14.66 \text{ volt} \quad Rs = 0.726 \text{ ohm}$$

Determining Rp and Qtot requires observing the battery for entire discharge periods. Combining the first two equations yields:

$$Rp * Iint = Eext + (Rp + Rs) * Iext$$

Integrating over a full discharge interval yields:

$$Rp * Qtot = \int Eext \, dt + (Rp + Rs) \int Iext \, dt$$

The value of Rs was already calculated above. Data from a discharge allows one to compute the integrals of Eext and Iext, leaving Rp and Qtot as unknowns. Using data from the two discharges, one obtains two equations which are solved simultaneously. The results yield values for the remaining two parameters in the battery model:

$$Rp = 495.6 \text{ ohm} \quad Qtot = 2791 \text{ amp second}$$

The estimates of internal resistance Rs and Rp allows one to infer the integral voltage Eint and current Iint of the battery from the external readings:

$$Eint = Eext - Iext * Rs$$

$$Iint = Iext + Eint/Rp$$

Figure 9:
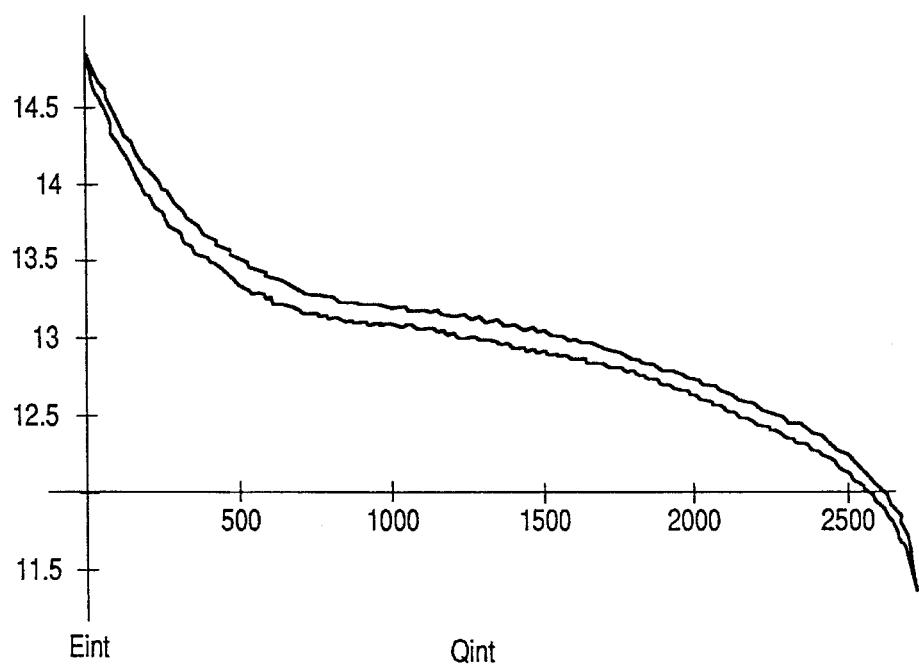
FIG. 9 shows the plot of two discharge curves, with Eint as a function of Qint.

The integral of Iint from the start of the discharge to any given time gives an accurate indication of the actual charge released internally from the battery to that time (call it Qint). Plotting released charge Qint against internal-voltage Eint gives the true internal discharge characteristics of the battery, unmodified by series resistance voltage drop and parallel resistance current shunting, and it is independent of discharge rate. FIG. 9 shows the plot of two discharge curves, with Eint as a function of Qint.

Note that there is no disk-access "bumps" in the Eext curves. However, at mid-discharge, there is approximately a 0.1 volt spread between the fast (i.e., upper) curve, and the slow (i.e., lower) curve, suggesting a miscalibration. The most likely source of this error was the initial estimate of Rs, based on the assumption that the initial readings of both discharges are produced at the same maximum Eint. It should be noted that the discharge curve is very steep at that point, and small differences in when the reading is taken will produce a large error.

Figure 10:
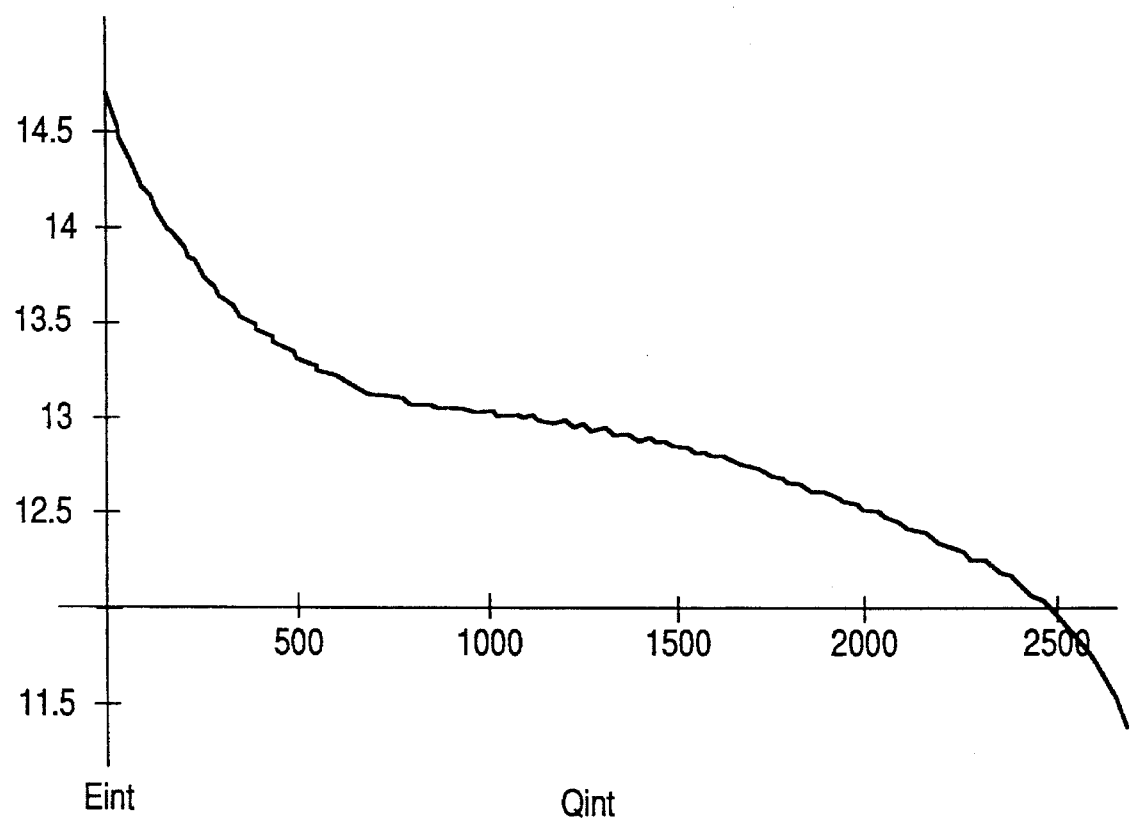
FIG. 10 shows the calibration discharge curve.

The fit of the curves after the calibration is a much better indication of the value of Rs than a single initial reading. Consequently, the calibration process is iterated with different values of Rs in order to minimize the spread of the fast and slow curves at the midpoint. In the currently preferred embodiment, an iterative root finder is used to reduce the error essentially to zero in less than five iterations. The resulting values given below:

$$Rs = 0.361 \text{ ohm} \quad Qtot = 2756 \text{ amp second}$$

$$Rp = 556 \text{ ohm} \quad Einit = 14.7 \text{ volt}$$

produce calibrated curves that are even smoother and nearly identical to the 6 watt and 1.5 watt discharges, thereby indicating a good, discharge-rate-independent model of the battery characteristics at a given temperature. The calibration discharge curve is shown in FIG. 10.

Temperature effects are modeled in the present invention by linear adjustment coefficients on Rs, Rp, and the discharge voltage curve. Two versions of the internal resistances and unified discharge curves are obtained in the way outlined above at two greatly different temperatures (e.g., 20° and 40° C. in the latest Type III battery curves). They are reconciled by fitting a linear function of temperature that connects the two, using a least-squares fit in the case of the discharge curves. The resistances and curves are then expressed as a nominal value offset by a temperature coefficient times the difference from a nominal temperature (e.g., chosen to be half way between the two test temperatures). Internal resistances, superposed curves (expressed in a P(Q | V) discrete distribution) and temperature coefficients together constitute the battery model, for each battery type, used in the battery meter.

Figure 11:
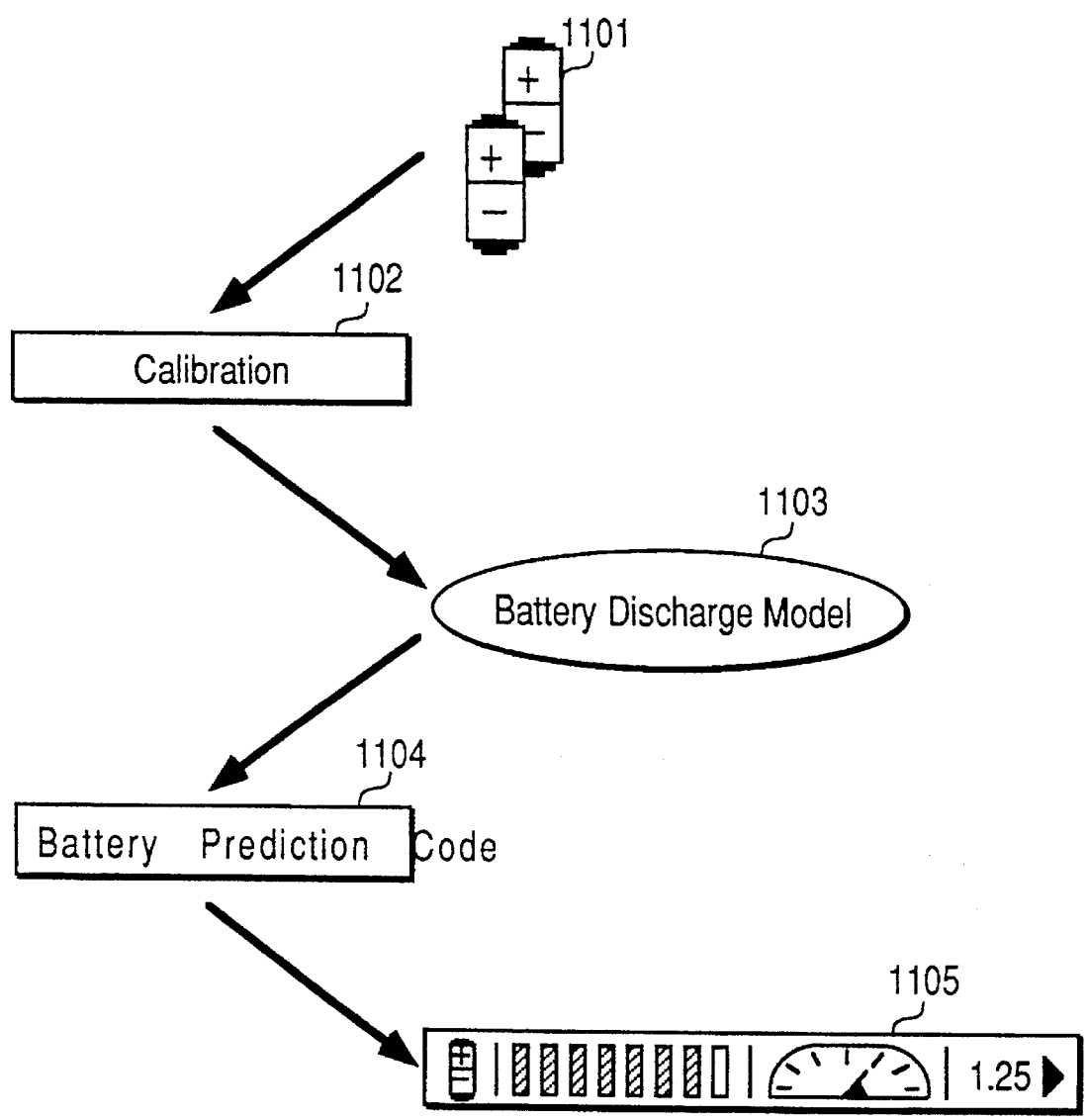
FIG. 11 shows an overview of the probabilistic modeling of the battery state.

FIG. 11 shows an overview of the probabilistic modeling of the battery state. First, the battery discharge curves by empirically measuring hot/cold and fast/slow discharges is determined, step 1101. These discharge curves are then calibrated, step 1102. A battery discharge model corresponding to that particular type of battery is established, step 1103. Next, a battery prediction code that predicts the actual charge of the battery by applying Bayes theorem is performed, step 1104. Finally, the charge of the battery according to the mean value of the battery discharge model is displayed, step 1105.

Figure 12:
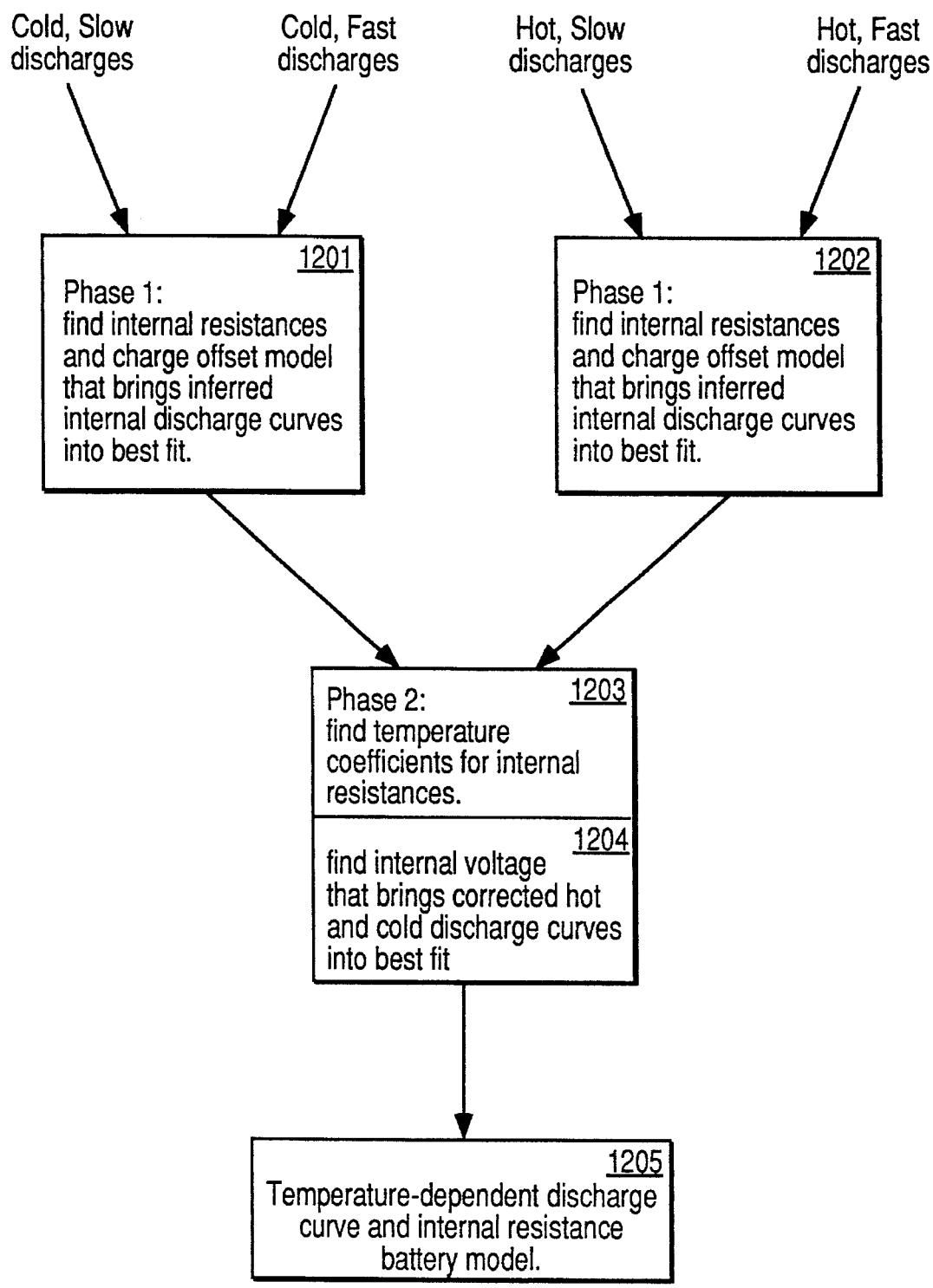
FIG. 12 is a flowchart describing the steps for performing the calibration procedure.

FIG. 12 is a flowchart describing the steps for performing the calibration procedure. The cold, slow discharge and the cold, fast discharge measurements are used to determine the internal resistances and also to determine the charge offset model that brings the inferred internal discharge curves into the best fit, step 1201. Likewise, the hot, slow discharge and the hot, fast discharge measurements are used to determine the internal resistances and also to determine the charge offset model that brings the inferred internal discharge curves into the best fit, step 1202. In step 1203, the temperature coefficients of the internal resistances are determined. The internal voltage that brings the corrected hot and cold discharge curves into the best fit, step 1204. Finally, the temperature-dependent discharge curve and the internal resistance battery model is developed, step 1205.

Figure 13:
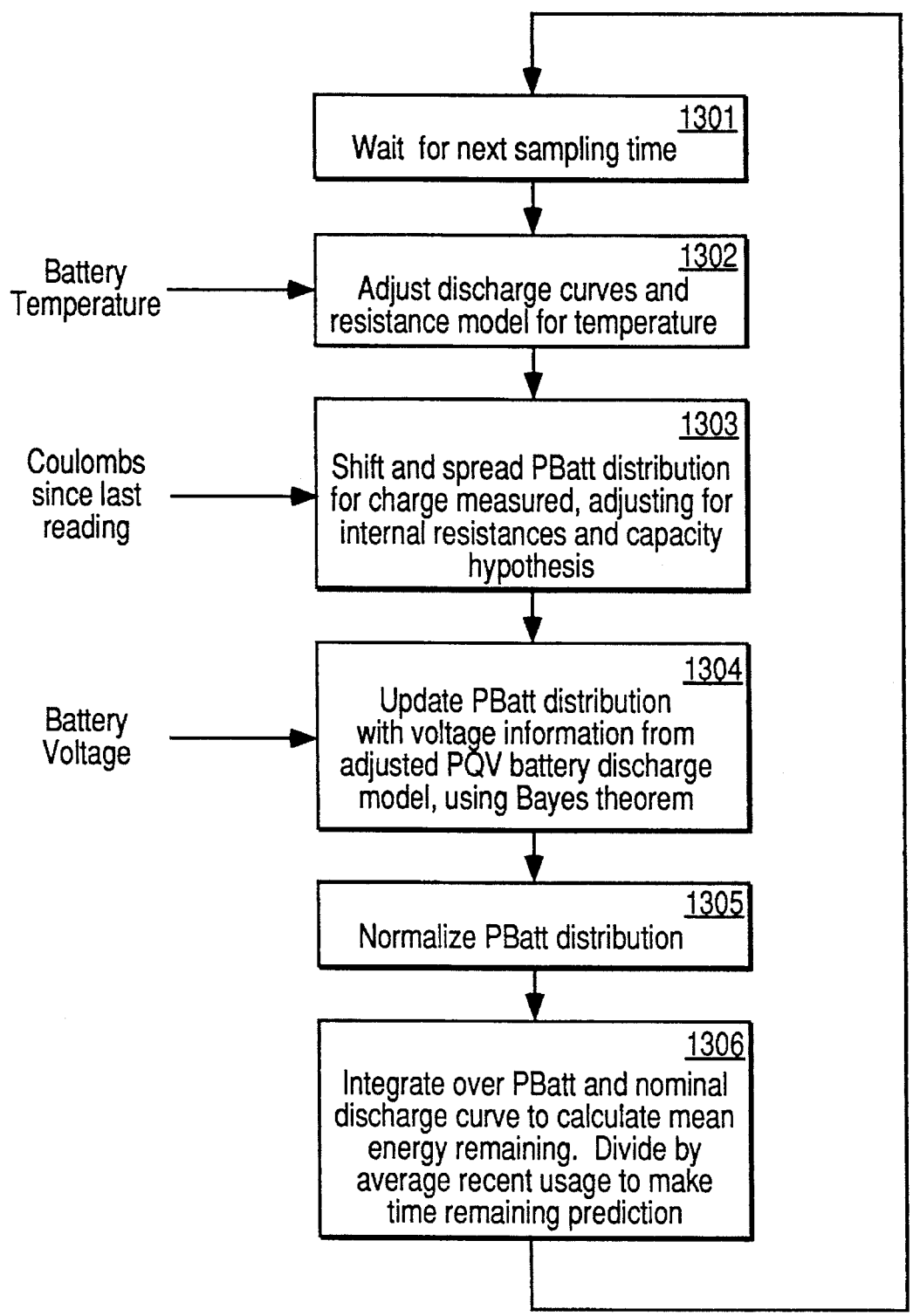
FIG. 13 is a flowchart describing the steps for performing the battery prediction.

FIG. 13 is a flowchart describing the steps for performing the battery prediction. Initially, the process waits for the next sampling time, step 1301. For the next sample, the battery temperature is measured. The discharge curves and the resistance model are adjusted based on the measured temperature, step 1302. The amount of current that had been discharged since the last reading is measured. This amount of discharged current is used to shift and spread the battery probability distribution, step 1303. The shifting process also accounts for internal resistances and capacity hypotheses. The battery voltage is measured. Based on the measured voltage, the battery probability distribution is updated, step 1304. Bayes theorem is used to adjust the battery discharge model. The battery probability distribution is then normalized, step 1305. The battery probability distribution and the nominal discharge curve is integrated to calculate the mean energy remaining, step 1306. The result is divided by the average recent usage to predict the amount of time remaining before the battery becomes totally discharged.

Thus, an apparatus and method for determining a charge of a battery is described.

What is claimed is:

1. In an electronic device powered by a battery, a method of analyzing a voltage signal to determine a charge of said battery for display on a display device, said method comprising the steps of:

determining a discharge curve corresponding to said battery, said discharge curve specifying voltage of said battery as a function of a state of charge of said battery;

calibrating said discharge curve;

formulating a battery state model, said model specifying probabilities of an actual charge of said battery for a plurality of possible battery capacities;

periodically obtaining the voltage signal by measuring a voltage of said battery;

updating said battery state model according to said voltage signal and said discharge curve by applying Bayes theorem;

normalizing said battery state model;

displaying on said display device a representation of said charge of said battery based on a mean value of said battery state model.

2. The method of claim 1 further comprising the steps of:

integrating over said battery state model;

integrating over a nominal discharge curve;

determining a mean remaining energy based on said integrating steps;

dividing said mean remaining energy by an average battery usage to predict a remaining amount of time of usage of said battery;

displaying said remaining amount of time.

3. The method of claim 1 further comprising the step of determining battery parameters from measured discharge curves corresponding to said battery.

4. The method of claim 1, wherein said calibrating step is performed according to measured temperature, internal resistances of said battery, and rate of discharge data.

5. The method of claim 1 further comprising the step of implementing a plurality of charge states corresponding to said battery, said plurality of charge states representing intervals of charges ranging from no charge to full charge.

6. The method of claim 1, wherein said display step displays on said display device said mean value and also displays a variance corresponding to a probability distribution of said battery state model.

7. The method of claim 1 further comprising the steps of:

measuring a current discharge from said battery;

shifting a probability distribution of said battery model based on said current discharge.

8. The method of claim 1 further comprising the steps of:

periodically obtaining said voltage signal by sampling said voltage of said battery;

multiplying said battery state model by a normal distribution based on said voltage signal.

9. In an electronic device having a charge storage device, a method of analyzing a voltage signal to determine a charge of said charge storing device for display on a display device, said method comprising the steps of:

defining a plurality of discrete intervals of charge ranging from no charge to full charge of said charge storing device;

establishing a probabilistic model of said charge storing device by establishing a probability for each of said discrete intervals of an actual charge corresponding to that particular discrete interval;

establishing a discharge curve specifying voltage of said charge storage device as a function of a state of charge of said charge storing device;

periodically obtaining the voltage signal by measuring a voltage of said charge storage device;

determining a probabilistic distribution of said charge storage device based on said voltage;

updating said probabilistic model by applying Bayes theorem to said probabilistic distribution;

displaying on said display device a representation of said charge of said charge storing device based on a mean of said probabilities.

10. The method of claim 9 further comprising the step estimating a total charge capacity of said charge storing device by:

quantizing said charge capacity into discrete intervals;

periodically updating said charge capacity and said charge of said charge storing device according to current discharge, voltage, and temperature measurements;

determining a probability weighted mean of said charge capacity and said charge intervals;

determining a remaining mean energy of said charge storing device based on said probability weighted mean.

11. The method of claim 9 further comprising the step of empirically determining a discharge curve corresponding to said charge storage device by measuring varying degrees of discharges under a range of temperature environments.

12. The method of claim 11 further comprising the step of updating said probabilistic model by multiplying a probability distribution corresponding to a measured voltage by said probabilistic model.

13. The method of claim 9 further comprising the steps of:

measuring a current discharge from said charge storage device;

shifting said probabilistic model according to said current discharge.

14. The method of claim 9 further comprising the step of calibrating said discharge curve according to estimates of internal resistances of said charge storing device as determined by externally measured parameters.

* * * * *